(12) United States Patent
Korsunsky et al.

(10) Patent No.: US 7,037,136 B1
(45) Date of Patent: May 2, 2006

(54) CONNECTOR MODULE

(75) Inventors: Iosif R. Korsunsky, Harrisburg, PA (US); Chong Hun Yi, Mechanicsburg, PA (US); Robert W. Brown, Hurrisburg, PA (US); Lewis R. Johnson, Dover, PA (US); Joanne E. Shipe, Harrisburg, PA (US); Tod M. Harlan, Mechanicsburg, PA (US); Richard B. Emenheiser, Mount Joy, PA (US); Richard L. Malehorn, York, PA (US); Charles (Chuck) Blichasz, Boiling Springs, PA (US); Eric Juntwait, Hummelstown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/059,002

(22) Filed: Feb. 15, 2005

(51) Int. Cl.
*H01R 13/648* (2006.01)

(52) U.S. Cl. ............... 439/607; 439/135; 361/728; 361/726; 361/816; 361/818; 361/690; 174/16.1; 174/35 R

(58) Field of Classification Search ........ 439/607–610, 439/939, 135, 541.5; 361/728, 754, 726, 361/816, 818, 690, 730, 752, 732; 174/16.1, 174/35 R
See application file for complete search history.

(56) References Cited

U.S. PATENT DOCUMENTS

| | | | |
|---|---|---|---|
| 6,508,670 B1 * | 1/2003 | Hwang | 439/607 |
| 6,517,382 B1 * | 2/2003 | Flickinger et al. | 439/607 |
| 6,655,995 B1 * | 12/2003 | Reisinger et al. | 439/607 |
| 6,666,694 B1 * | 12/2003 | Daly et al. | 439/79 |
| 6,666,720 B1 * | 12/2003 | Reisinger et al. | 439/607 |
| 6,780,053 B1 * | 8/2004 | Yunker et al. | 439/607 |
| 6,819,568 B1 * | 11/2004 | Cao | 361/728 |
| 6,824,429 B1 * | 11/2004 | Hwang | 439/607 |
| 6,867,969 B1 * | 3/2005 | Hwang | 361/690 |
| 6,875,056 B1 * | 4/2005 | Bianchini et al. | 439/608 |
| 6,885,560 B1 * | 4/2005 | Zaremba | 361/754 |

* cited by examiner

*Primary Examiner*—Gary F. Paumen
(74) *Attorney, Agent, or Firm*—Wei Te Chung

(57) ABSTRACT

A connector module for receiving a signal converter and electrically connecting the signal converter to a printed circuit board mounted within an electronic system. The connector module includes a conductive cage having a plurality of press-fit type pins and a shielding lid. The connector module further defines a top opening and a cavity with an opening on a bottom portion of the conductive cage for receiving the connector which electrically connecting with the signal converter. The shielding lid covers on the top opening. The connector comprises a plurality of contacts each having a press-fit end, said press-fit ends extending toward the printed circuit board and mounting therein.

13 Claims, 5 Drawing Sheets

CONNECTOR MODULE

BACKGROUND OF THE INVENTION

1. Field of the Invention

The present invention relates to a connector module, and in particular to a connector module employed in an electronic device for transmitting/receiving high speed signals.

2. Description of the Prior Art or Related Art

A small form-factor pluggable transceiver (SFP transceiver) provides a link between an electronic transmission line and an optical transmission line as a bi-direction optical-electronic converter. The SFP transceiver is mounted on a printed circuit board of a host system device via a high-speed connector. Then SFP transceiver and the connector are received in an EMI (electromagnetic interference) cage to avoid being interfered with by outside or emit electromagnetic circumstance.

Many designs of the EMI cages and connector modules (comprising a connector and a transceiver) have been introduced for better performance, such as EMI performance and so on. Another consideration for design should be convenience of mounting and rework performance as important considerations for the connector module. Most of the traditional designs only provide for full connector and cage rework function. For example, U.S. Pat. No. 6,517,382 discloses a SFP transceiver received in a cage and a connector mounted on a printed circuit board. The shielding cage comprises a removable top cover which defines a plurality of slots on side-arms thereof corresponding to a plurality of tabs defined on the sidewalls of the shielding cage. In the prior art only can the transceiver rework, the connector and cage, which are mounted (normally soldered) on the printed circuit board, cannot easily rework. Cooperation of the cage top tab and slot cannot be separated conveniently, particularly when there are multiple cages or other devices mounted near the cage to be worked on. Furthermore, the cooperation of tab and slot has a clearance fit therebetween which cannot make sure of enough positive force, thus cannot achieve good electrical performance.

U.S. Pat. No. 6,666,720 discloses a cage variation with an integrated kickout means. However, in this design removing the top cover for access to the connector for rework is further complicated because two operations are required: latches must be released and either an eye-of-needle retention must be overcome or a disordering process must be performed.

U.S. Pat. No. 6,508,670 discloses another slot & tab type cage. The shielding cage, made from a single piece of sheet metal, includes a plurality of press-fit type pins extending from sidewalls of the shielding cage for mounting on a printed circuit board, with the top of the cage defined by two formed edges, anchored by a previously described tab and latch. Potential for reworking the connector by treating the top as a movable hinge is not likely, as full reverse bending of the edge to clear for connector removal would result in cracks. Therefore, connector rework in this case would require full cage removal. Additionally, because there is not enough space in cage for stiffening ribs for press-fit pins, there is no press-fit pin on the bottom wall of the shielding cage, which can reduce EMI electrical performance. This patent does not specifically address connector rework design.

If a connector in the connector module needs to be updated or does not work, to substitute the connector with a new one is difficult and may damage a printed circuit board because the connector is normally soldered on a printed circuit board. Furthermore, all of above-mentioned prior arts fail to provide every individual component (cage, and connector) rework function at no expense of damaging the components and deteriorating the electrical performance. As host system devices develop, multiple connector modules come into application, in which individual component rework function is more important because there are more components in the multiple connector modules.

Hence, an improved connector module is desired to overcome the above-mentioned disadvantages of the prior and related arts.

BRIEF SUMMARY OF THE INVENTION

A primary object of the present invention is to provide a connector module having individual component rework function.

Another object of the present invention is to provide a connector module having a good EMI performance.

Still another object of the present invention is to provide a compact connector module structure.

A connector module for receiving a signal converter and electrically connecting the signal converter to a printed circuit board mounted within an electronic system. The connector module includes a conductive cage having a plurality of press-fit type pins and a shielding lid. The connector module further defines a top opening and a cavity with an opening on a bottom portion of the conductive cage for receiving the connector which electrically connecting with the signal converter. The shielding lid covers on the top opening. The connector comprises a plurality of contacts each having a press-fit end, said press-fit ends extending toward the printed circuit board and mounting therein.

Still another objects, advantages and novel features of the invention will become more apparent from the following detailed description of a preferred embodiment when taken in conjunction with the accompanying drawings.

DETAILED DESCRIPTION OF THE INVENTION

Reference will now be made in detail to a preferred embodiment of the present invention.

Figure 1:
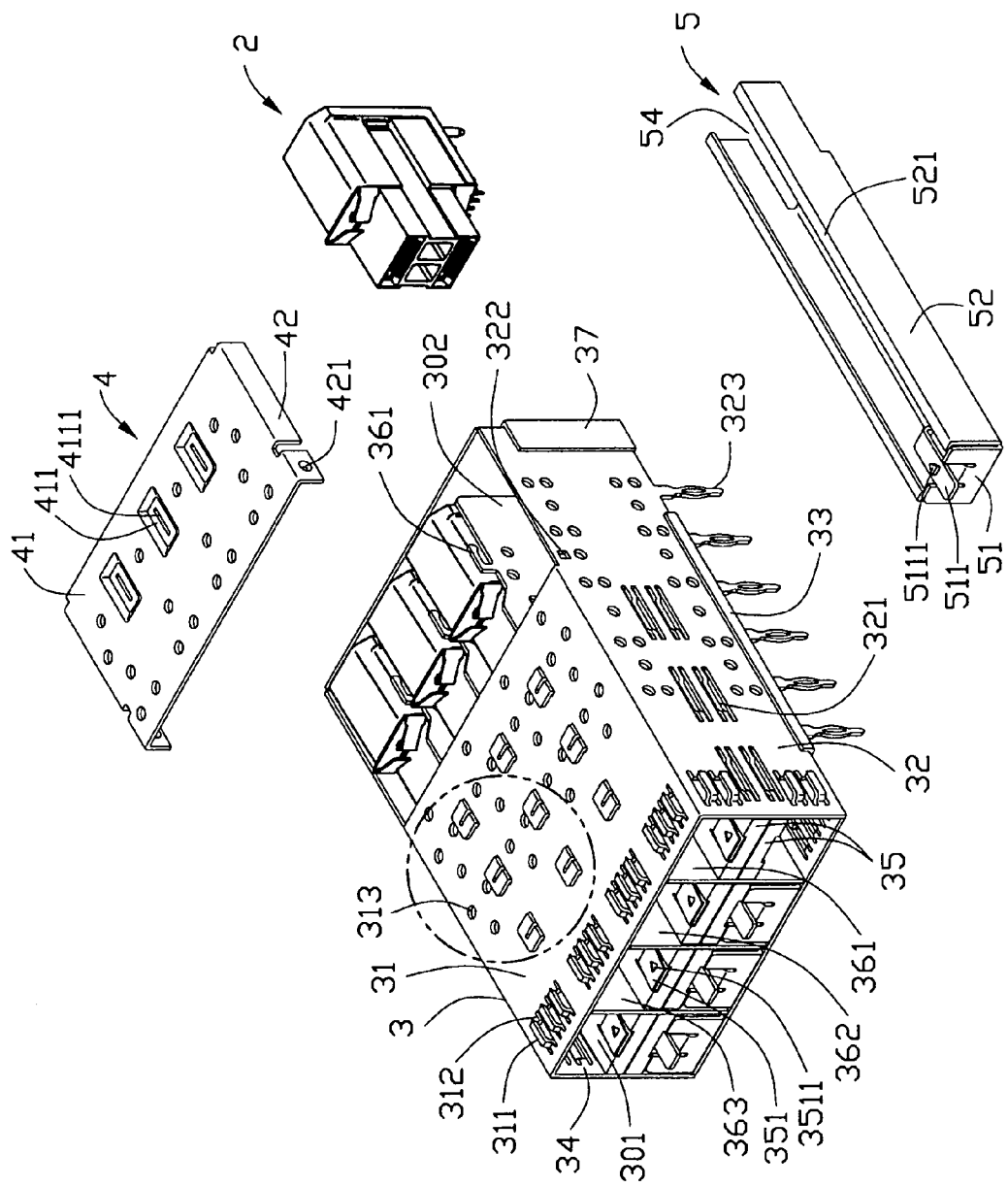
FIG. 1 is a perspective view of a connector module in accordance with a preferred embodiment of the present invention.

Referring to FIG. 1, a connector module in accordance with a preferred embodiment of the present invention mounted on a printed circuit board (not shown) of a host system device, comprises a plurality of connectors 2, a substantially cubic shielding cage 3 for receiving said connectors 2, a removable shielding lid 4 covering on the top surface of the shielding cage 3, a plurality of signal converters (not shown) received in the shielding cage 3 or a plurality of retainers 5 received in the shielding cage 3 for retaining the connectors 2 during shipment and placement to the printed circuit board and acting as removable/replaceable dust covers after the connectors 2 placement before mounting the signal converts.

The shielding cage 3 is made by metal sheet and comprises a top and bottom walls 31, 33, a pair of sidewalls 32, 34, a front opening and a rear wall 37. The shielding cage 3 further comprises four pairs of horizontal separating walls 35 therein and a first, second and third parallelly vertical separating walls 361, 362, 363. The first, second and third vertical separating walls 361, 362, 363 extend from the front opening to the rear wall 37 of the shielding cage 3 and are arranged in same interval between the sidewalls 32, 34. The four pairs of horizontal separating walls 35 extend rearward from the front opening and are perpendicular to and are shorter than the vertical separating wall 361. Each pair of horizontal separating walls 35 comprises a lower one and an upper one stacked on the lower one. Said four pairs of horizontal separating walls 35 are located at the midpoint of the height of the shielding cage 3. Therefore, the front portion of the shielding cage 3 is divided into four upper receiving rooms 301 and four lower receiving rooms 301. The rear portion of the shielding cage 3 is divided into four same receiving cavities 302 by the first, second and third parallelly vertical separating walls 361, 362, 363 because the horizontal separating walls 35 are shorter than the first, second and third vertical separating walls 361, 362, 363.

The top wall 31 comprises a first opening adjacent to the rear wall 37 of the shielding cage 3. The first opening is above and communicates with the receiving cavities 302. The top wall 31 further comprises a plurality of bent metal strip 311 adjacent to a front edge thereof, a plurality of slits (not labeled) below the bent metal strips 311, a plurality of short metal pieces 312 protruding into the slits, and a plurality of holes 313. The bottom wall 33, sidewalls 32, 34, also contain a plurality of bent metal strips, short metal pieces and holes. The sidewalls 32, 34 further comprise a plurality of concave strips 321 bent from the shielding cage 3 and corresponding slits (not labeled) thereof. The bent metal strips 311, the short metal pieces 312, the holes 313, the concave strips 321 and the slits may be distributed on each wall of the shielding cage 3 according to cooling request and EMI performance of the shielding cage 3 or following some standards known in this art.

Figure 3:
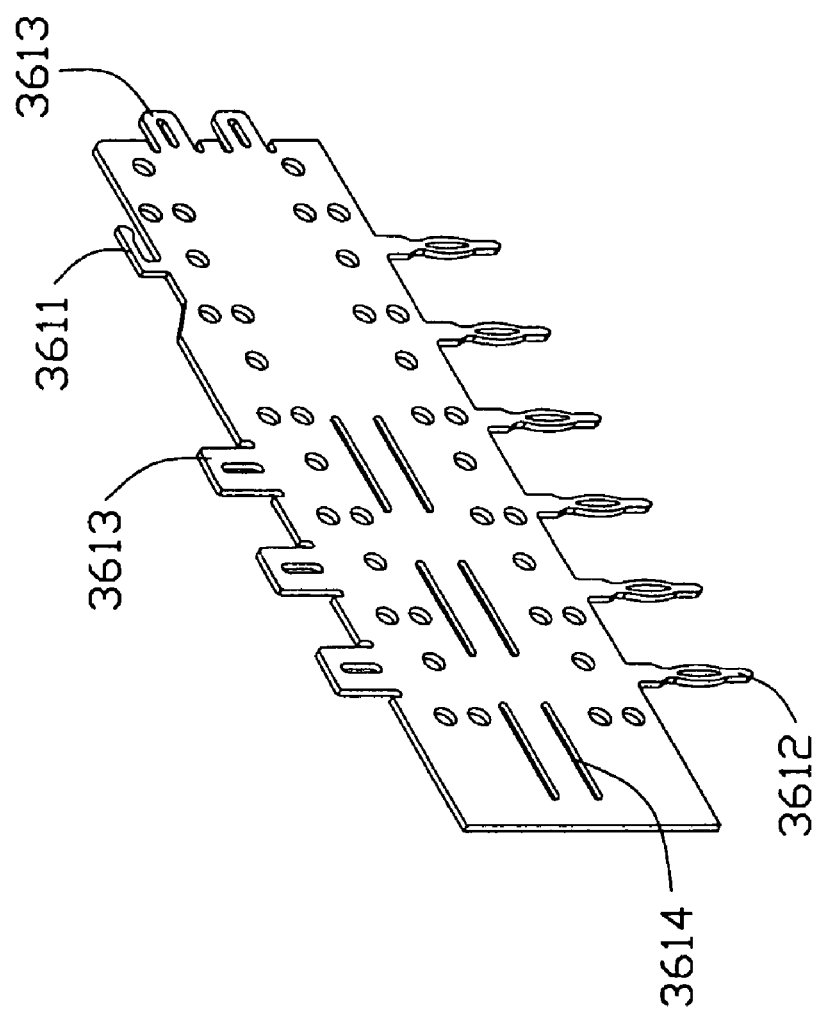
FIG. 3 is perspective view of a first vertical separating wall of the connector module of FIG. 1.

Reference to FIGS. 1 and 3, each upper or lower horizontal separating wall 35 comprises an elastic tongue 351 bent into corresponding receiving room 301 therefrom. Each elastic tongue 351 defines an aperture 3511 thereon. The first vertical separating wall 361 is made by a metal sheet and comprises an L-like portion 3611 extending from an upper edge, a plurality of press-fit type pins 3612 extending from a lower edge, a plurality of n-like retaining pieces 3613 extending from the upper edge and a rear edge, and a plurality of slits 3614 on a middle portion for mounting the horizontal separating walls 35.

Figure 4:
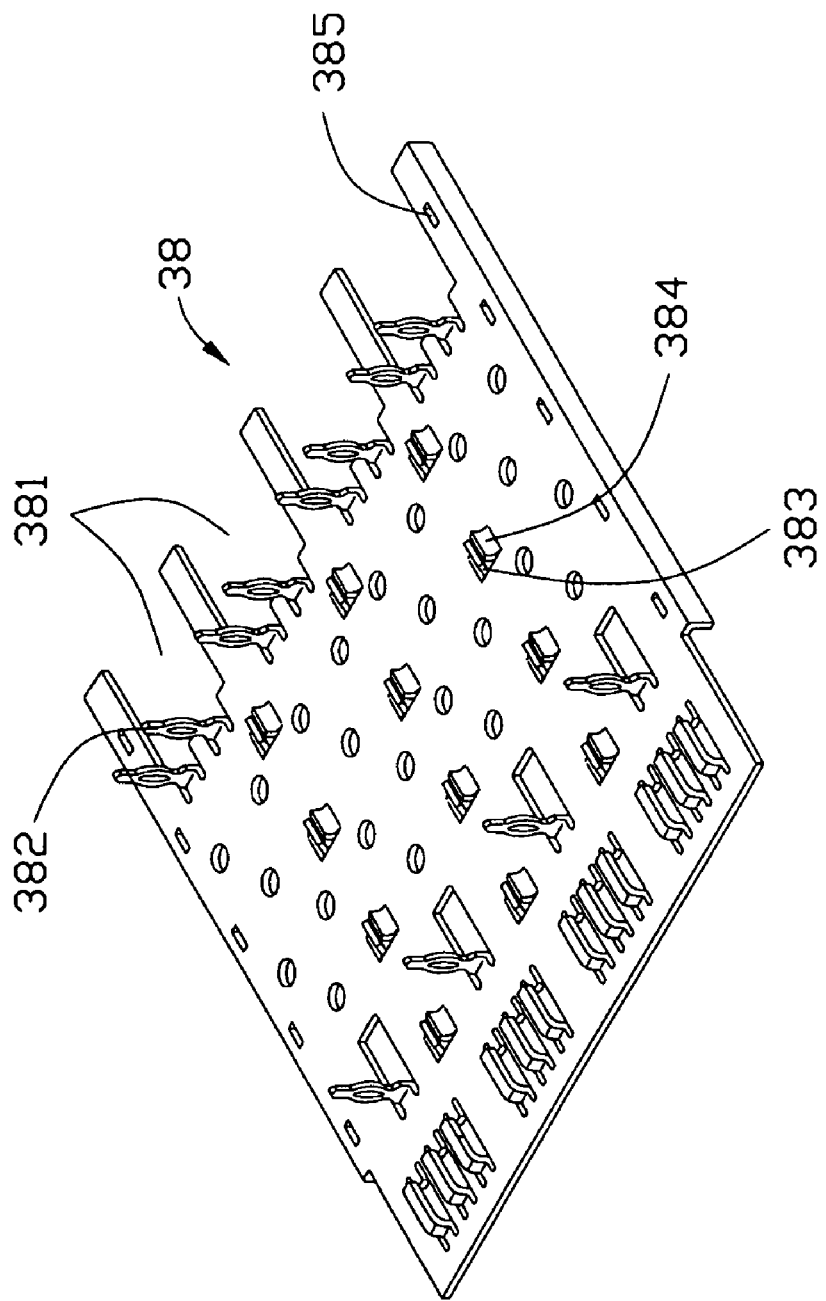
FIG. 4 is perspective view of a bottom wall of the connector module of FIG. 1.

Reference to FIG. 4, the bottom wall 38 comprises four openings 381 communicating with the four receiving cavities 302, a plurality of press-fit pins 382 bent therefrom, a plurality of pairs of retaining pieces 383, 384 blanked therefrom and a plurality of slits 385 for allowing a plurality of press-fit pins 323 extending from the sidewall 32 to the printed circuit board. Each pair of the retaining tabs 383, 384 abutting against each other to define an elastic openable slit therebetween, through which the press-fit type pins 3612 of first vertical separating wall 361 plug into the printed circuit board.

Figure 5:
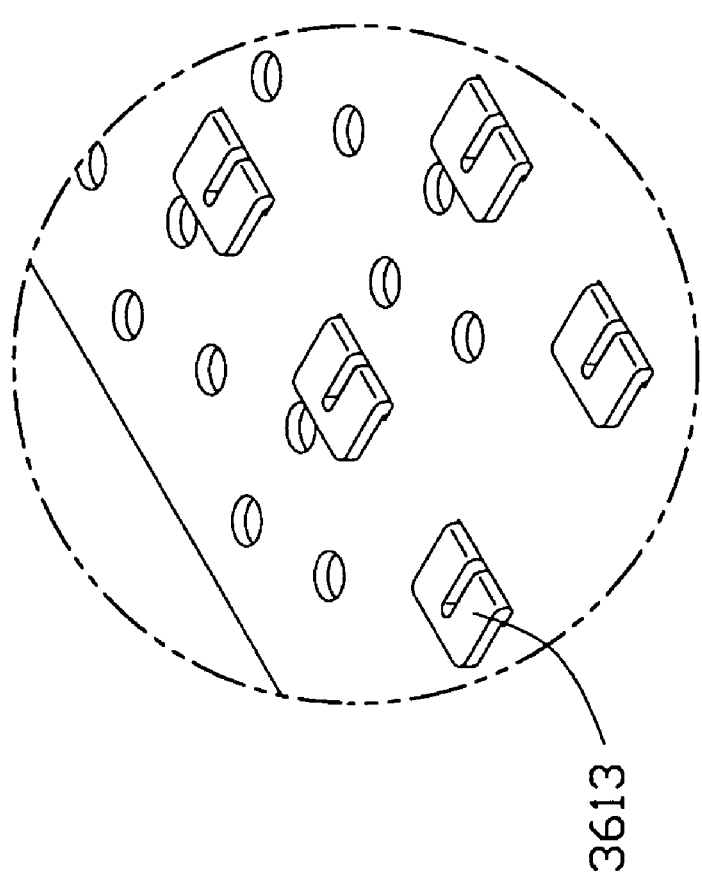
FIG. 5 is an enlarged view of a top wall of the connector module of FIG. 1.

Reference to FIG. 5, the n-like metal retaining pieces 3613 extend through corresponding slits of the top wall 31 and are vertical bent on the top wall 31. Such cooperation also exists between the vertical separating walls 361–363 and the rear wall 37. The bent n-like retaining pieces 3613 will give positive force to the top wall 31, from which the full electrical performance of the shielding cage 3 benefits.

Figure 2:
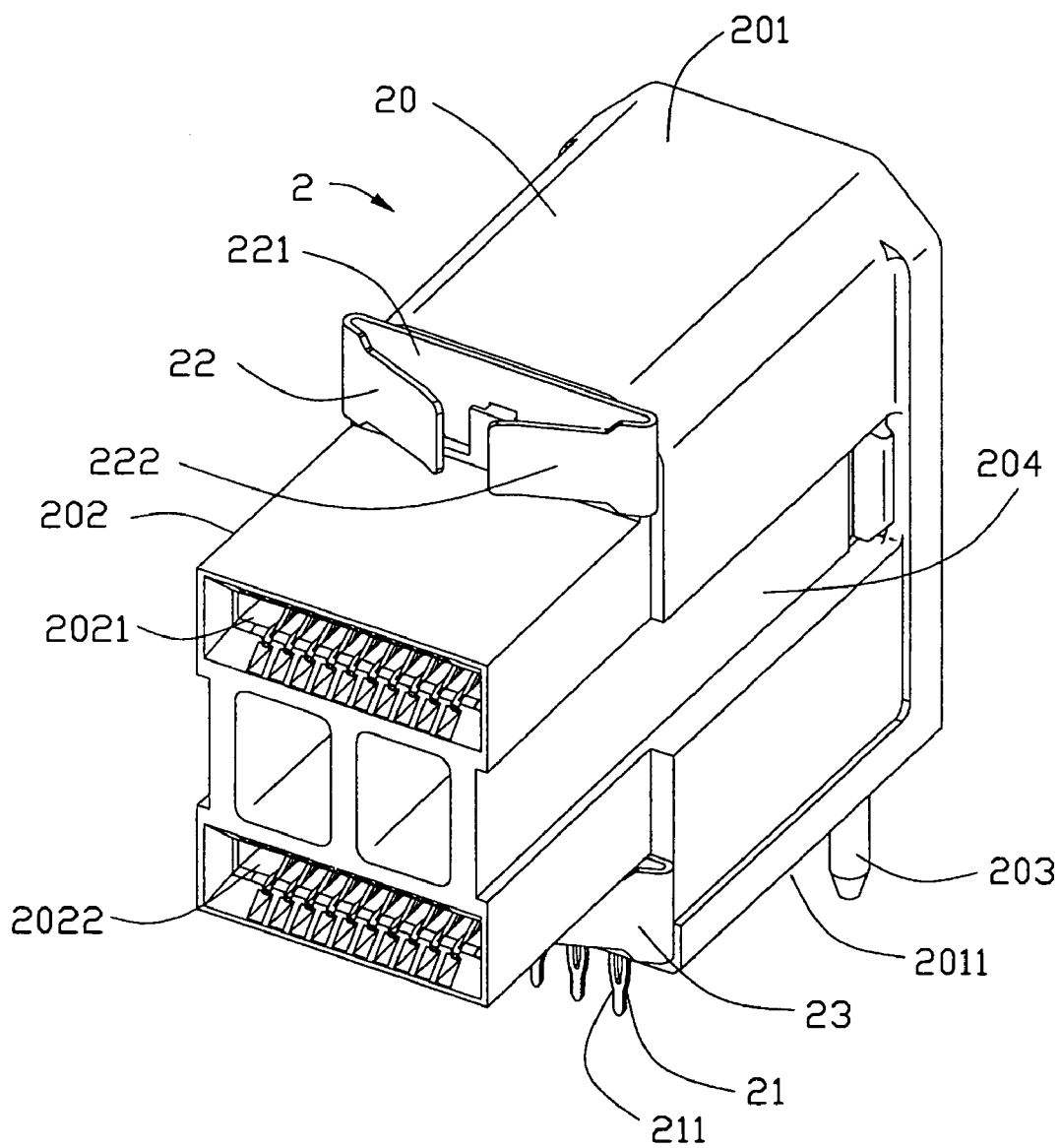
FIG. 2 is a perspective view of a connector of the connector module of FIG. 1.

Reference to FIG. 2, each connector 2 received in the a corresponding a receiving cavity 302 and comprises a housing 20 and a plurality of contacts 21. The housing 20 comprises a main body 201 and a mating body 202 extending forwardly from a front surface of the main body 201. A first and second mating ports 2021, 2022 are defined on a front portion of the main body 201. The main body 201 defines a third mating port 2011 on a bottom portion thereof. Each contact 21 extends from the first and second mating ports 2021, 2022 to the third mating port 2011 and comprises a press-fit type end 211 extending through the third port 2011. The housing 20 further comprises a pair of mounting legs 203 adjacent to the third port 2011, a pair of grooves 204 defined on sidewalls thereof, and a pair of spring pieces 22, 23 respectively mounted on upper portion and lower portion of the front surface of the main body 201. The mating body 202 is between the pair of spring pieces 22, 23. The spring pieces 22, 23 comprise a plate body 221 mounted on the main body 201 and a pair of spring arms 222 respectively extend forwardly toward to each other from two ends of the plate body 221.

Reference to FIG. 1, the shielding lid 4 is removably engaged with the shielding cage 3 and comprises a top plate 41, a pair of side arms 42, a plurality of concave features 411, a plurality of matching slits 4111 defined on the concave features 411 and a pair of protruding points 421 defined on inner surfaces of the side arms 42 respectively. Said matching slits 4111 engage with the L-like portions 3611 respectively. Said pair of protruding points 421 engage with a pair of notches 322 defined on the sidewalls 32, 34 of the shielding cage 3. By above-mentioned engagement, the shielding lid 4 can be removably mounted on the first opening of the shielding cage 3 and also can be conveniently removed.

The retainer 5 is rectangular and has a substantially same width with the connector 2. The retainer 5 comprises a front wall 51, a U-like elastic piece 511, a protruding latch 5111 defined on the U-like elastic piece 511 corresponding to the aperture 3511 of the horizontal separating walls 35, sidewalls 52, retaining edges 521 inwardly extending from upper ends of the sidewalls 52, a bottom wall and an opening defined on a rear end of said retainer 5. The U-like elastic piece 511 extends inwardly from the front wall 51 and then reflexes outwardly with the protruding latch 5111 beyond the front wall 51.

The connector 2 are plugged into corresponding receiving cavities 302 respectively with the press-fit ends 211 of the contacts 21 passing through corresponding openings 381 of the bottom wall into the printed circuit board of the host system device. The signal converters are received in an upper and lower receiving rooms 301 respectively. The first and second mating port 2021, 2022 of the connector 2 are exposed to the upper and lower receiving rooms 301 to electrically connect with corresponding signal converters. Before the signal converters mounting to shielding cage 3 or during shipment, the retainer 5 will be placed into receiving rooms 301. The retaining edge 521 of the retainer 5 is received in the grooves 204 and engages with side steps of the grooves 204 for retaining the connector 2 during shipment or placement to the printed circuit board. At the same time, the front wall 51 covers on a front opening of corresponding receiving room 301 and severs as a dust cover for preventing dust from outside. A rear end of the retainer 5 elastically presses on the spring piece 22. Then the latch 5111 engages with the aperture 3511 of the horizontal separating wall 35. The retainer 5 can be removed from the shielding cage 3 by release of the pressed spring piece 22 after separating the latch 5111 from the aperture 3511 by pushing down the U-like elastic piece 511. In this case, the spring pieces 22, 23 are acted as kickout units and can be substituted by other like means, such as helical springs. Because of the press-fit type ends 211 of the contacts 21, the connector 2 can be pulled out by tools after the shielding lid 4 is removed from the top of the shielding cage 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic system for electrically connecting a plurality of signal converters to a printed circuit board, the electronic system comprising:
   a shielding cage including a horizontal separating wall dividing the front portion of the shielding cage into two receiving rooms and a plurality of vertical separating walls dividing the two receiving rooms into a plurality of receiving rooms for receiving the signal converters;
   a plurality of connectors received in a back portion of the shielding cage and each including an upper port and a lower port for electrically connecting with signal converters respectively; and
   a shielding lid removably covering a top opening defined on the shielding cage for the connector rework.

2. The electronic system as claimed in claim 1, wherein the vertical separating walls comprise a plurality of n-like retaining pieces extending through corresponding slits of a top wall of the shielding cage and fastened thereon.

3. The electronic system as claimed in claim 1, wherein the vertical separating walls comprise a plurality of press-fit pins plugging into the printed circuit board through a pair of retaining pieces blanked from a bottom wall of the shielding cage.

4. The electronic system as claimed in claim 1, wherein the shielding cage comprises a pair of sidewalls from which a plurality of press-fit pins protrude through a plurality of slits defined on the bottom wall into the printed circuit board.

5. The electronic system as claimed in claim 4, wherein the bottom wall of the shielding cage comprises a plurality of press-fit pins bent into the printed circuit board.

6. The electronic system as claimed in claim 1, wherein the connectors each comprises a plurality of press-fit pins mounted to the printed circuit board.

7. The electronic system as claimed in claim 1, further comprising a plurality of refers received in the receiving rooms before corresponding signal converters being mounted into the receiving rooms.

8. The electronic system as claimed in claim 7, wherein the retainer comprises retainer edges which are received in grooves defined on sidewalls of the connector.

9. The electronic system as claimed in claim 7, wherein each retainer acts as a dust cover after the connector placement.

10. The electronic system as claimed in claim 9, wherein each connector comprises a spring piece for ejecting corresponding signal converter or retainer.

11. An electrical system comprising:
    a printed circuit board;
    a conductive cage downwardly fastened to the printed circuit board, said cage defining a plurality of receiving rooms for horizontally receiving signal converters, and a top wall with a top opening around a rear portion thereof;
    electrical connectors mounted to the printed circuit board and located under said top opening for coupling to the horizontally inserted signal converters; and
    a shielding lid moveably covering the top opening; wherein
    said top opening is dimensioned large enough to allow the electrical connector to be moved upwardly from the cavity through said top opening for reworking under a condition that the conductive cage is still fastened to the printed circuit board while said shielding lid is moved away from the top opening.

12. The electrical system as claimed in claim 11, wherein said shielding lid is essentially discrete from the top wall while pivotally connected to an edge of said top wall.

13. An electrical system comprising:
    a printed circuit board;
    a conductive cage downwardly fastened to the printed circuit board, said cage defining a horizontal cavity with a front opening for horizontally receiving a signal converter, and a top wall with a top opening around a rear portion thereof;
    an electrical connector mounted to the printed circuit board and located in a rear portion of the cavity and under said top opening for coupling to the horizontally inserted signal converter; and
    a shielding lid moveably covering the top opening; wherein
    said top opening is dimensioned large enough to allow the electrical connector to be moved upwardly from the cavity through said top opening for reworking under a condition that the conductive cage is still fastened to the printed circuit board while said shielding lid is moved away from the top opening; wherein
    said shielding lid is essentially discrete from the top wall while pivotablly connected to an edge of said top wall.

* * * * *